US009716198B2

(12) United States Patent
Qian et al.

(10) Patent No.: US 9,716,198 B2
(45) Date of Patent: Jul. 25, 2017

(54) PHOTOVOLTAIC INTERCONNECT WIRE

(71) Applicant: Fundant (Jiangsu) Advanced Materials Co., Ltd., Jintan, Jiangsu (CN)

(72) Inventors: Haipeng Qian, Jiangsu (CN); Hao Yu, Jiangsu (CN)

(73) Assignee: FUNDANT (JIANGSU) ADVANCED MATERIALS CO., LTD., Jintan (CN)

( * ) Notice: Subject to any disclaimer, the term of this patent is extended or adjusted under 35 U.S.C. 154(b) by 0 days.

(21) Appl. No.: 14/902,010

(22) PCT Filed: Jul. 18, 2014

(86) PCT No.: PCT/CN2014/082451
§ 371 (c)(1),
(2) Date: Dec. 30, 2015

(87) PCT Pub. No.: WO2015/014218
PCT Pub. Date: Feb. 5, 2015

(65) Prior Publication Data
US 2016/0336471 A1  Nov. 17, 2016

(30) Foreign Application Priority Data

Jul. 31, 2013  (CN) .......................... 2013 1 0330865

(51) Int. Cl.
*H01B 7/18* (2006.01)
*H01L 31/05* (2014.01)
(Continued)

(52) U.S. Cl.
CPC .............. *H01L 31/05* (2013.01); *B23K 35/00* (2013.01); *B23K 35/0255* (2013.01);
(Continued)

(58) Field of Classification Search
CPC ....... H01B 9/025; H01B 11/1041; H01B 7/18
(Continued)

(56) References Cited

U.S. PATENT DOCUMENTS 1,738,828 A * 12/1929 Hews ....................... H01B 5/02
174/133 R
3,609,207 A *  9/1971 Maschio .............. H01B 9/0611
174/120 FP
(Continued)

FOREIGN PATENT DOCUMENTS

CN        101789452 A      7/2010
CN        202004027 U     10/2011
(Continued)

OTHER PUBLICATIONS

1st Office Action of counterpart Chinese Patent Application No. 201310330865.X issued on Dec. 31, 2014.

*Primary Examiner* — Chau N Nguyen

(57) ABSTRACT

A photovoltaic interconnect wire includes a conductive base strip with grooves provided thereon, and the grooves are linear and/or curved strip-shaped grooves (3) arranged obliquely to a longitudinal direction of the conductive base strip. An inclination angle of 15° to 75° is present between each linear strip-shaped groove and the longitudinal direction of the conductive base strip, and between a tangent line of any point on the curve of a curved-shaped groove and the longitudinal direction of the conductive base strip. The photovoltaic soldering strip increases an output power of a solar cell assembly by increasing the total reflection proportion. It also ensures soldering fastness by adjusting flat regions of the base strip. Effective cross section loss of the conductive base strip is reduced by adjusting the angle of each groove, so as to minimize the confluence efficiency loss of the soldering strip.

17 Claims, 3 Drawing Sheets

(51) Int. Cl.
*B23K 35/00* (2006.01)
*B23K 35/02* (2006.01)
*H01L 31/18* (2006.01)
*H01L 31/054* (2014.01)

(52) U.S. Cl.
CPC .......... *H01L 31/054* (2014.12); *H01L 31/188* (2013.01); *Y02E 10/52* (2013.01)

(58) Field of Classification Search
USPC .................. 174/102 R, 102 SP, 106 R, 117 F
See application file for complete search history.

(56) References Cited

U.S. PATENT DOCUMENTS

| | | | | |
|---|---|---|---|---|
| 5,213,868 A * | 5/1993 | Liberty | ................. | H01L 23/367 |
| | | | | 257/712 |
| 6,831,231 B2 * | 12/2004 | Perelman | ........... | H01B 11/1826 |
| | | | | 174/102 R |
| 8,278,556 B2 * | 10/2012 | Waltz | ................... | H01B 7/0009 |
| | | | | 174/126.3 |
| 2003/0178224 A1 * | 9/2003 | Goto | ........................ | H01B 7/30 |
| | | | | 174/133 R |

FOREIGN PATENT DOCUMENTS

| | | |
|---|---|---|
| CN | 102569470 A | 7/2012 |
| CN | 102737754 A | 10/2012 |

\* cited by examiner

PHOTOVOLTAIC INTERCONNECT WIRE

TECHNICAL FIELD

The invention relates to the field of photovoltaic interconnect wire fabrication technologies, and particularly to a photovoltaic interconnect wire.

BACKGROUND ART

With the rapid development of world economy, energy consumption is ever increasing, and countries in the world are in need of new energy to use widely. The greenhouse effect resulted from carbon dioxide emissions has caused global warming and natural disasters, making demand on clean and renewable energy by countries worldwide very strong. After the global crisis caused by the US subprime mortgage crisis in 2007 became more serious and widespread, each country has taken active measures to encourage the use of renewable energy, so as to stimulate economic growth. The Obama government bid to invest $150 billion into the development of clean energy in the next 10 years. The European Union has set a target that in 2020 renewable energy shall take up to 20% of the total used energy. Japan has proposed that more than 70 percent of newly-built houses would be installed with solar panels (about 70 GW) until 2030. To ease the shortage of domestic demands for photoelectric products, the Ministry of Finance of the People's Republic of China announced, on Mar. 26, 2009, the implementation of a model project "Solar Roofs Plan". It is clearly stated in "Implementation Suggestions on accelerating applications of solar photovoltaics in buildings" jointly issued by the Ministry of Finance and the Ministry of Housing and Urban-Rural Development, that a series of principles and measures shall be taken to help implementation of the "Solar Roofs Plan", including providing financial support to model projects which apply solar photovoltaics to buildings, promoting technical progresses and innovations, encouraging local governments to provide financial support, strengthening policy supports for the building field and so on. Currently, the application of solar energy technologies is well guided under the following strategies: for example, model projects involving solar roofs, photovoltaic curtain walls and other building integrated photovoltaics are actively promoted in economically advanced large and medium-sized cities having better infrastructures, off-grid power generating techniques are actively developed in rural and remote areas, and power is then transmitted to the countryside. By means of the solar roofs, photovoltaic curtain walls and other building integrated photovoltaics, people can better understand advantages of applying solar energy in a short time, which will also promote wider application thereof, and motivate industrial capitals to invest in the field of solar energy sources. Policies on new energy issued by individual countries will probably become one of the most important policies affecting the world development in the next 15 years. The Copenhagen Climate Conference in 2009 has woken up and strengthened people's awareness of clean energy sources once again. With the development and application of new energy, it is expected that the photovoltaic industry will experience further rapid growth.

An interconnect wire is an important material for soldering photovoltaic modules. The quality of the interconnect wire can therefore directly affect the efficiency of the photovoltaic modules for collecting current, which has a major impact on the power of the photovoltaic modules. It has always been a research topics of much interest in the interconnect wire area of how to increase the conversion rate and reduce the fragmentation ratio of solar cells by isomerizing the interconnect wire.

Chinese Patent application CN101789452A provides an interconnect wire coated with tin, which includes a copper wire with a tin layer coated thereon, where pits are uniformly distributed on a surface of the tin layer. With this interconnect wire, sunlight can be diffused in the pits to some extent, thereby increasing energy received from the sunlight. However, with just diffuse reflection occurs in the pits of this interconnect wire, only a small proportion of sunlight is reflected back to the solar cell, leading to a limited increase of the conversion rate. Furthermore, as the pits are fabricated when tin is coated on the copper wire, an uneven solder layer may be generated, which may cause the solar cells to be infirmly soldered with the interconnect wire, i.e., rosin joint might occur.

Chinese Patent application CN102569470A discloses a method of forming v-grooves perpendicular to a length direction of an interconnect wire on surfaces of the interconnect wire for reducing cracks and fragmentations of solar cells. However, in this type of interconnect wire, the v-grooves are perpendicular to the length direction thereof and there is no obvious gap between adjacent v-grooves. Therefore, this type of interconnect wire cannot be firmly soldered to solar cells, which may cause defective soldering joint.

SUMMARY OF THE INVENTION

The invention aims to solve the following technical problems. The conventional photovoltaic interconnect wires cannot efficiently reflect sunlight incident onto the interconnect wire to solar cells. Even if pits causing the sunlight to be diffused are formed on the surface of the interconnect wire, only a small proportion of sunlight is reflected by the pits back to the solar cells. Furthermore, the formation of pits affects the quality of the interconnect wire, which causes the surface of the interconnect wire not having the pits to protrude. Moreover, the number of pits will significantly reduce the soldering firmness of the interconnect wire. In addition, the pits on the surface of the interconnect wire will reduce the cross-section area of the interconnect wire. As a result, the resistivity of the interconnect wire will increase correspondingly. That is, the conductivity of the interconnect wire will slightly decrease, which is disadvantageous to the conversion rate of solar cells. The invention provides a photovoltaic interconnect wire, which allows more sunlight reflected by the interconnect wire to be totally reflected at an interface between glass of a photovoltaic module and air. The totally reflected sunlight will be photoelectrically converted again, thereby improving the power of the photovoltaic cell by 0.5% to 2.5%. Moreover, an internal stress of the solar cell after being soldered can be reduced moderately, thereby preventing fragmentations of the solar cell resulted from expansion and contraction of the interconnect wire. Furthermore, an effective soldering area can be guaranteed even with grooves pressed on a surface of the interconnect wire, ensuring that the solar cell can be firmly soldered. In addition, the grooves are provided so as to have the least impact on the conductivity of the interconnect wire, meeting practical requirements.

The technical problem is solved with the following technical solution: a photovoltaic interconnect wire, comprising a conductive base strip made of a metal or alloy material and having an upper widthwise surface and a lower widthwise surface.

A plurality of grooves are pressed on one or two of the widthwise surfaces of the conductive base strip, and a flat base strip region remains between adjacent grooves.

A depth of each of the grooves is 5% to 50% of a thickness of the conductive base strip when the grooves are pressed on only one of the widthwise surfaces of the conductive base strip.

A depth of each of the grooves is 5% to 45% of a thickness of the conductive base strip, and a sum of a maximum depth of grooves pressed on the upper widthwise surface and a maximum depth of grooves pressed on the lower widthwise surface is no more than 50% of the thickness of the conductive base strip, when the grooves are pressed on both the upper and lower widthwise surfaces of the conductive base strip.

The grooves on the widthwise surfaces of the conductive base strip are repeated regularly along a length direction of the conductive base strip. On one hand, it helps total reflection on the conductive base strip to be evenly distributed. On the other hand, the flat base strip regions are uniformly distributed, which facilitates both the soldering and the fabrication of the conductive base strip.

A coefficient of thermal expansion of a solar cell is generally different from that of an interconnect wire. Normally, the base strip of the interconnect wire is made of copper or copper alloy, and the solar cell is a silicon wafer. In this case, the coefficient of thermal expansion of copper or copper alloy is greater than that of silicon. When being soldered, the base strip expands in both the length direction and the width direction when heated. After cooing, the degree of contraction of the base strip is greater than that of the solar cell. At this point, the interconnect wire and the solar cell have been fixed together. Therefore, the interconnect wire will exert a force to the solar cell, which may locally bend the solar cell inward, thereby deforming the solar cell locally. To provide a contraction space for the interconnect wire, the grooves are straight strip-shaped grooves and/or curved strip-shaped grooves arranged obliquely to the length direction of the conductive base strip. An inclination angle of 15 degrees to 75 degrees is present between the straight strip-shaped grooves and the length direction of the conductive base strip, and an inclination angle of 15 degrees to 75 degrees is present between a line tangent to any point on the curved strip-shaped grooves and the length direction of the conductive base strip.

The grooves may oblique along one direction, that is, all of the stripe-shaped grooves are in parallel with each other. Alternatively, the grooves may also intersect each other.

A total area of base strip regions on one widthwise surface takes about 30% to 70% of a total area of the one widthwise surface of the conductive base strip.

A solder layer is plated or heat-coated on the conductive base strip. The solder layer may be directly plated or heat-coated on the conductive base strip. Alternatively, a protective film may also be formed on the conductive base strip first, and then the solder layer may be plated or heat-coated on the protective film. Moreover, for the purpose of saving solder usage and reducing the manufacturing cost, it can plated or heat-coated the solder layer on only one widthwise surface of the conductive base strip. Therefore, the surface of the conductive base strip provided with the grooves may or may not have a solder layer.

The proportion of the total area of the flat base strip regions on one widthwise surface to the total area of the one widthwise surface of the conductive base strip is a key factor, which shall be configured as allowing an effective soldering area to be guaranteed even though the grooves are pressed on the surface of the interconnect wire, ensuring that the solar cell are firmly soldered. In addition, the depth of the grooves is limited, such that the pressing of the grooves within the set depth range will not have a negative impact on the surface opposite to the one pressed with the grooves.

As the base strip expands in both the length direction and the width direction when being heated, the grooves on a same widthwise surface are arranged as intersecting each other, which also includes the scenario of the grooves not only intersecting each other but also being parallel to each other. Two grooves intersecting each other may have an identical inclination angle, such as 60 degrees. That is, the two intersecting grooves mirror each other with respect to the length direction of the conductive base strip. However, two intersecting grooves may also have different inclination angles.

Specifically, the grooves are straight strip-shaped grooves, and oblique along two inclination directions, and grooves respectively along the two inclination directions mirror each other with respect to the length direction of the conductive base strip.

An inclination angle of 25 degrees to 65 degrees is present between the grooves of both inclination directions and a width direction of the conductive base strip.

The grooves on a same widthwise surface are arranged as being parallel to each other. Each groove is inclined to both the length direction and the width direction of the conductive base strip.

On one hand, the internal stress of the interconnect wire shall be reduced. On the other hand, the capacity of the grooves in reflecting sunlight back to the solar cells as much as possible shall be improved. Considering of the above, for each of the grooves on the conductive base strip, a size of the groove decreases gradually from the opening to the bottom of the groove, and a plane tangent to at least one point on the bottom surface of the groove has an inclination angle of 20.9 degrees to 45 degrees with respect to the widthwise surface of the conductive base strip. In condition that light is emitted from an optically denser medium to an optically thinner medium, once the incident angle is increased to a critical angle, the refraction angle reaches 90 degrees and refracted light will totally disappear, that is, only reflected light is left, which is known as total reflection. A critical angle for sunlight to be totally reflected at an interface between glass of a photovoltaic module and air is 41.8 degrees. Therefore, if the incident angle, at which the sunlight reflected by the grooves of the interconnect wire is incident onto the interface between the glass of the photovoltaic module and air, is greater than or equal to the critical angle, the sunlight can be totally reflected at that interface, and then the totally reflected sunlight may be photoelectrically converted again. Therefore, the actual power of the photovoltaic module can be improved by 0.2% to 2% by means of the special grooves provided on the surface of the interconnect wire. The grooves may be concave grooves, or may also be v-grooves. In case of concave grooves, the inclination angle of the bottom surface of the grooves changes gradually, and generally decreases gradually from the opening to the bottom of the groove. In this case, it is possible that only a part of all inclination angles of the bottom surface of the concave groove meets the requirement that the sunlight reflected by the grooves of the interconnect wire is totally reflected at the interface between the glass of the photovoltaic module and air. That is, only a part of inclination angles of the bottom surface of the concave groove is greater than or equal to the critical angle required for the sunlight incident onto the interface between the glass of the photovoltaic module and air to be totally reflected by the grooves of the interconnect wire. In practice, a plane tangent to the bottom surface of the concave groove at any point on the bottom surface of the concave groove may have an inclination angle of 20.9 degrees to 45 degrees with respect to the widthwise surface of the interconnect wire.

The conductive base strip is made of copper, copper-aluminum alloy, copper-silver alloy, copper-silver-aluminum alloy, or an alloy formed by adding rare earth materials to high-purity raw copper.

Regarding the solder layer plated or heat-coated on the conductive base strip, it may be one or more of tin-lead alloy, tin-bismuth alloy, tin-copper alloy, tin-cerium alloy, tin-silver alloy, pure tin and tin-silver-copper alloy. There may be one or more solder layers, with a total thickness of 3 μm to 30 μm.

Furthermore, one or more ultrathin protective films with a thickness of 0.1 μm to 10 μm may be plated between the conductive base strip and the solder layer.

In the invention, the grooves on one widthwise surface of the conductive base strip may be in different shapes and may be distributed in different ways. Furthermore, the grooves on the two widthwise surfaces of the conductive base strip may be different in shape and distribution.

The photovoltaic interconnect wire of the invention can realize a comprehensive balance in at least the following four aspects, by considering real needs of customers, to benefit of the customers to the most: 1) the overall effective output power of the photovoltaic module is increased by improving the total reflection proportion of sunlight incident onto the interconnect wire; 2) the interconnect wire and the solar cell are firmly soldered together by adjusting the proportion of the total area of the flat base strip regions to the total area of the base strip; 3) loss in effective cross-section area of the conductive base strip is reduced by adjusting the angle of the grooves, so as to minimize the loss in current collection efficiency of the soldering strip and ensure the conductivity of the interconnect wire; and 4) the risk that the solar cell cracks and fragments after cooling of the soldering, due to the fact that the coefficient of thermal expansion of the solar cell is different from that of the interconnect wire, is reduced, by adjusting the depth of the grooves and the inclination angle between each strip-shaped groove and the length direction of the soldering strip.

Figure 1:
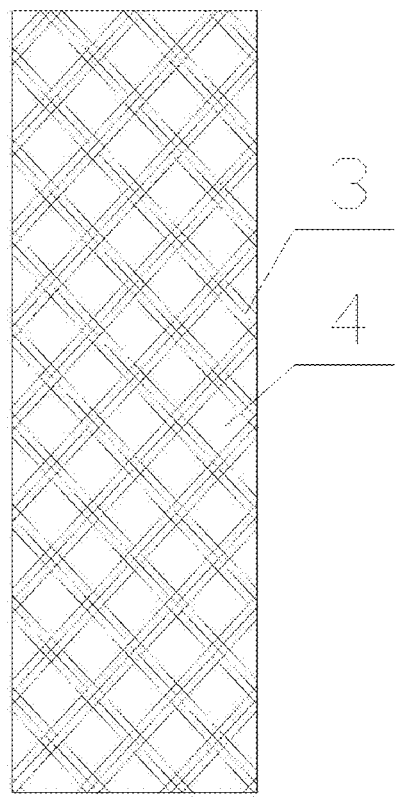
FIG. 1 schematically illustrates a configuration according to a first embodiment of the invention.

In the figures, 1—conductive base strip, 2—solder layer, 3—groove, and 4—flat base strip region.

DETAILED DESCRIPTION OF EMBODIMENTS

The invention will be further described in detail in the following in combination with the drawings. All the drawings are schematic diagrams for illustrating general structures of the invention, and therefore only components related to the invention are shown.

Embodiment 1

In this embodiment, TU1 oxygen-free copper is selected to form a conductive base strip with a thickness of 0.22 mm. Linear strip-shaped v-grooves 3 uniformly arranged as intersecting each other are pressed on one or two widthwise surfaces of the conductive base strip. A diamond-shaped flat base strip region 4 is formed between two adjacent grooves 3. A total area of the flat base strip regions 4 on one widthwise surface occupies 35% of a total area of the one widthwise surface of the conductive base strip 1. Each of the linear strip-shaped v-grooves 3 is inclined to both a length direction and a width direction of the conductive base strip 1, and the linear strip-shaped v-grooves 3 are inclined along only two different inclination directions. In the embodiment, linear strip-shaped v-grooves along the two inclination angles mirror each other with respect to the length direction of the conductive base strip 1, and the two inclination angles are substantially 60 degrees to the width direction of the conductive base strip 1.

A depth of each groove 3 is substantially 30% of a thickness of the conductive base strip 1, when the grooves 3 are pressed on only one of the widthwise surfaces of the conductive base strip 1.

The depth of each groove 3 is 20% to 30% the thickness of the conductive base strip 1, and a sum of a maximum depth of the grooves 3 pressed on an upper widthwise surface and a maximum depth of the grooves 3 pressed on a lower widthwise surface is no more than 50% the thickness of the conductive base strip 1, when the grooves 3 are pressed on both the upper and lower widthwise surfaces of the conductive base strip 1.

A solder layer 2 made of tin-copper alloy and having a thickness of 10 um is plated or heat-coated on the conductive base strip 1 pressed with the grooves 3, to form a photovoltaic interconnect wire.

For each of the grooves 3 on the conductive base strip 1, a size of the groove 3 decreases gradually from the opening to the bottom of the groove 3, and a plane tangent to a point at a bottom surface of the groove has an inclination angle of 20.9 degrees to 45 degrees with respect to the widthwise surface of the conductive base strip 1.

When 60 pieces of 156*156 polycrystalline silicon wafer are used to form a group of photovoltaic modules by using the interconnect wire of the invention, a power of such photovoltaic modules is 4 W higher than that formed by using a conventional interconnect wire. That is, the power is increased by 1.7%.

A soldering force exerted by the interconnect wire is a force required to peel the interconnect wire from the solar cell when the interconnect wire is pulled away from the solar cell along a direction of 45 degrees with respect to the solar cell. Such a force may be measured with a tensiometer. The soldering force normally has to be greater than 3N. The soldering force exerted by the interconnect wire according to the embodiment is greater than 4N, which meet the above requirement.

A conductivity of the interconnect wire is reduced by 0.2% or less as a result of the special pattern design of the grooves, which has little impact on the performance of the interconnect wire.

A ratio of fragmentation caused by an internal stress of the interconnect wire after cooling of the soldering, is no more than 0.02 percent.

Figure 2:
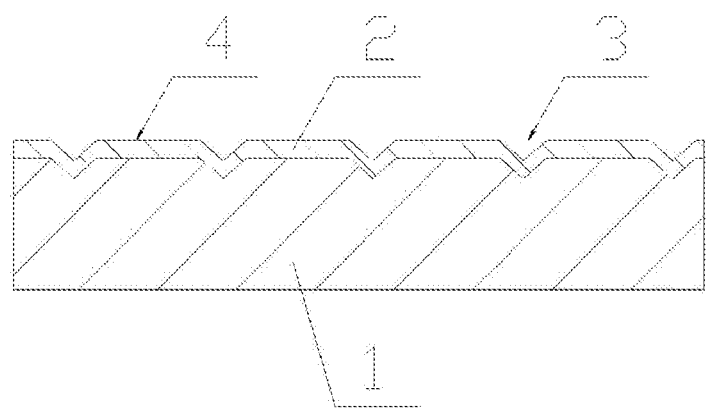
FIG. 2 schematically illustrates a cross section of FIG. 1 where the grooves are v-grooves.
Figure 3:
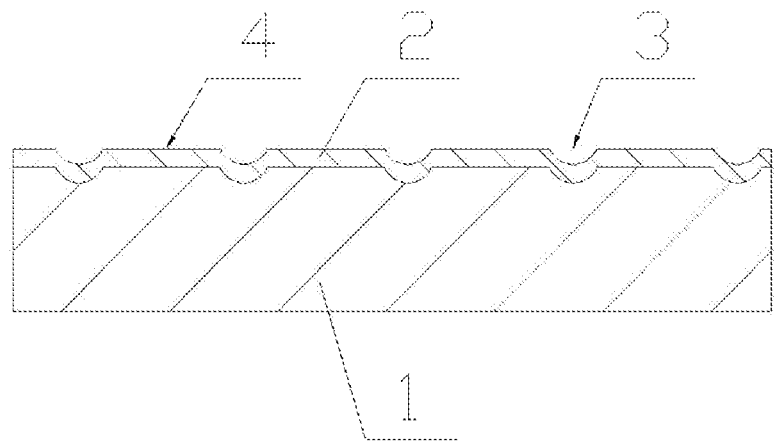
FIG. 3 schematically illustrates a cross section of FIG. 1 where the grooves are concave grooves.

FIGS. 1 and 2 illustrate a configuration of this interconnect wire. However, the grooves 3 may also be concave grooves as illustrated in FIG. 3. In FIG. 3, for each of the grooves 3 on the conductive base strip 1, a size of the groove 3 decreases gradually from the opening to the bottom of the groove 3, and a plane tangent to at least one point on a bottom surface of the groove has an inclination angle of 20.9 degrees to 45 degrees with respect to a widthwise surface of the conductive base strip 1.

Embodiment 2

This embodiment is substantially the same as Embodiment 1, except that the total area of the flat base strip regions 4 on one widthwise surface takes up 30% of the total area of the one widthwise surface of the conductive base strip 1. The grooves 3 are pressed on only one widthwise surface of the conductive base strip, and the depth of each groove 3 is substantially 5% of the thickness of the conductive base strip 1. Moreover, there is an inclination angle of substantially 15 degrees between an inclination direction of linear strip-shaped v-grooves inclined along the two directions and the width direction of the conductive base strip 1.

When 60 pieces of 156*156 polycrystalline silicon wafer are used to form a group of photovoltaic modules by using the interconnect wire of the invention, a power of such photovoltaic modules is 2.3 W higher than that formed by using a conventional interconnect wire. That is, the power is increased by 1%.

According to the method for measuring the soldering force described in Embodiment 1, the soldering force exerted by the interconnect wire according to the embodiment is greater than 4N, satisfying the requirement.

A conductivity of the interconnect wire is reduced by 0.3% or less as a result of the special pattern design of the grooves, which has little impact on the performance of the interconnect wire.

A ratio of fragmentation caused by an internal stress of the interconnect wire after cooling of the soldering is no more than 0.02 percent.

Embodiment 3

This embodiment is substantially the same as Embodiment 1, except that the total area of the flat base strip regions 4 on one widthwise surface takes 70% of the total area of the one widthwise surface of the conductive base strip 1. The grooves 3 are pressed on both the widthwise surfaces of the conductive base strip 1, with the depth of the grooves 3 on one widthwise surface being 20% of the thickness of the conductive base strip 1, and the depth of the grooves 3 on the other widthwise surface being 30% of the thickness of the conductive base strip 1. Moreover, there is an inclination angle of substantially 75 degrees between an inclination direction of linear strip-shaped v-grooves inclined along the two directions and the width direction of the conductive base strip 1.

When 60 pieces of 156*156 polycrystalline silicon wafer are used to form a group of photovoltaic modules by using the interconnect wire of the invention, a power of such photovoltaic modules is 1.2 W higher than that formed by using a conventional interconnect wire. That is, the power is increased by 0.5%.

According to the method for measuring the soldering force described in Embodiment 1, the soldering force exerted by the interconnect wire according to the embodiment is greater than 4N, satisfying the requirement.

A conductivity of the interconnect wire is reduced by 0.3% or less as a result of the special pattern design of the grooves, which has little impact on the performance of the interconnect wire.

A ratio of fragmentation caused by an internal stress of the interconnect wire after cooling of the soldering is no more than 0.02 percent.

Embodiment 4

Figure 4:
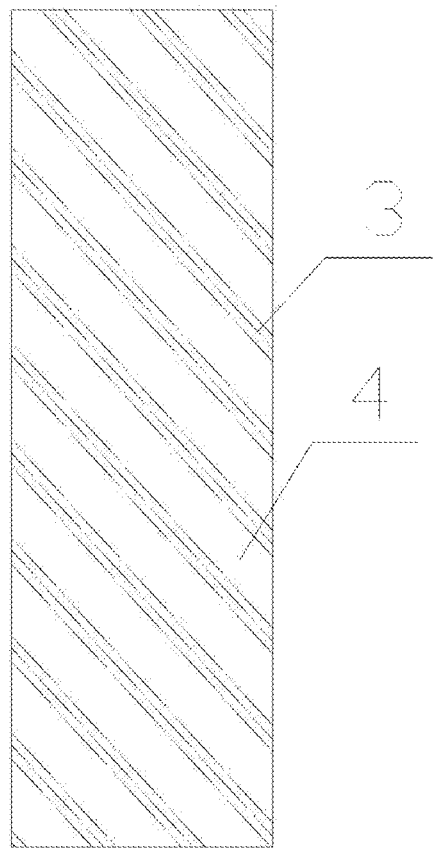
FIG. 4 schematically illustrates a configuration according to a fourth embodiment of the invention.

As shown in FIG. 4, a configuration according to a fourth embodiment of the invention is illustrated. This embodiment differs from Embodiment 1 in that linear strip-shaped v-grooves 3 parallel to each other are pressed on one or two widthwise surfaces of the conductive base strip. A strip-shaped flat base strip region 4 is formed between adjacent grooves 3. A total area of the flat base strip regions 4 on one widthwise surface occupies 45% of a total area of the one widthwise surface of the conductive base strip 1. A depth of each groove 3 is 20% of the thickness of the conductive base strip 1; and a solder layer 2 is formed by plating.

When 60 pieces of 156*156 polycrystalline silicon wafer are used to form a group of photovoltaic modules by using the interconnect wire of the invention, a power of such photovoltaic modules is 3 W higher than that formed by using a conventional interconnect wire. That is, the power is increased by 1.25%.

According to the method for measuring the soldering force described in Embodiment 1, the soldering force exerted by the interconnect wire according to the embodiment is greater than 4N, satisfying the requirement.

A conductivity of the interconnect wire is reduced by 0.3% or less as a result of the special pattern design of the grooves, which has little impact on the performance of the interconnect wire.

A ratio of fragmentation caused by an internal stress of the interconnect wire after cooling of the soldering is no more than 0.02 percent.

Embodiment 5

Figure 5:
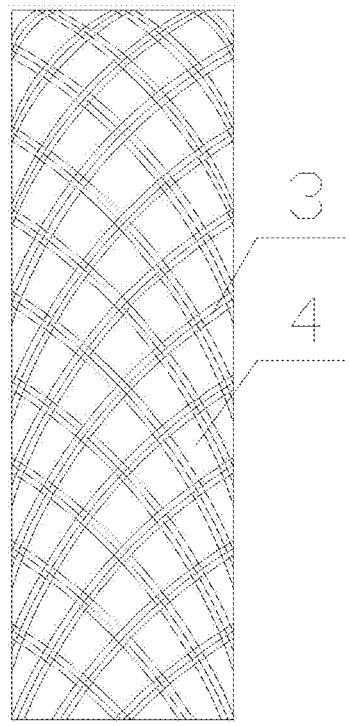
FIG. 5 schematically illustrates a configuration according to a fifth embodiment of the invention.

As shown in FIG. 5, a configuration according to a fifth embodiment of the invention is illustrated. This embodiment differs from the first embodiment in that the linear strip-shaped v-grooves 3 are replaced with curved strip-shaped v-grooves 3 and a base strip region 4 is formed. A total area of the flat base strip regions 4 on one widthwise surface occupies 45% of a total area of the one widthwise surface of the conductive base strip 1. A depth of each groove 3 is 30% of the thickness of the conductive base strip 1; and the solder layer 2 is formed by plating.

When 60 pieces of 156*156 polycrystalline silicon wafer are used to form a group of photovoltaic modules by using the interconnect wire of the invention, a power of such photovoltaic modules is 3 W higher than that formed by using a conventional interconnect wire. That is, the power is increased by 1.25%.

According to the method for measuring the soldering force described in Embodiment 1, the soldering force exerted by the interconnect wire according to the embodiment is greater than 4N, satisfying the requirement.

A conductivity of the interconnect wire is reduced by 0.3% or less as a result of the special pattern design of the grooves, which has little impact on the performance of the interconnect wire.

A ratio of fragmentation caused by an internal stress of the interconnect wire after cooling of the soldering is no more than 0.02 percent.

Embodiment 6

Figure 6:
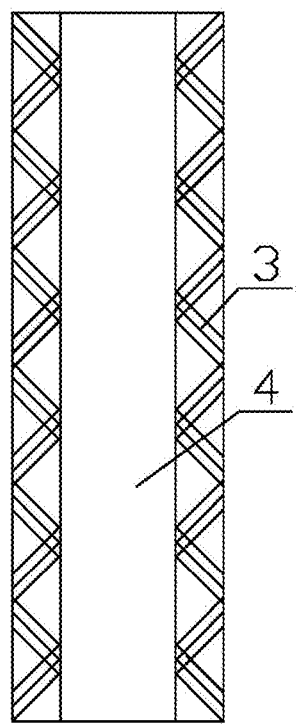
FIG. 6 schematically illustrates a configuration according to a sixth embodiment of the invention.

As shown in FIG. 6, a configuration according to a sixth embodiment of the invention is illustrated. This embodiment differs from Embodiment 1 in that the linear strip-shaped v-grooves 3 are pressed on both sides of the widthwise surface along the length direction of the conductive base strip 1. A flat base strip region 4 is formed in the central part of the conductive base strip 1 along the length direction of the conductive base strip 1; and a total area of the flat base strip region 4 on one widthwise surface occupies 50% of a total area of the one widthwise surface of the conductive base strip 1. A depth of each groove 3 is 20% of the thickness of the conductive base strip 1; and the solder layer 2 is formed by plating or heat-coating.

When 60 pieces of 156*156 polycrystalline silicon wafer are used to form a group of photovoltaic modules by using the interconnect wire of the invention, a power of such photovoltaic modules is 2.4 W higher than that formed by using a conventional interconnect wire. That is, the power is increased by 1%.

According to the method for measuring the soldering force described in Embodiment 1, the soldering force exerted by the interconnect wire according to the embodiment is greater than 4N, satisfying the requirement.

A conductivity of the interconnect wire is reduced by 0.3% or less as a result of the special pattern design of the grooves, which has little impact on the performance of the interconnect wire.

A ratio of fragmentation caused by an internal stress of the interconnect wire after cooling of the soldering is no more than 0.02 percent.

The invention claimed is:

1. A photovoltaic interconnect wire, comprising a conductive base strip (1) made of a metal or alloy material and having an upper widthwise surface and a lower widthwise surface, wherein a plurality of grooves (3) are pressed on at least one of the upper widthwise surface and the lower widthwise surface of the conductive base strip (1), wherein the plurality of grooves (3) are either v-shaped grooves or curve-shaped grooves, and a flat base strip region (4) remains between adjacent grooves (3), wherein a depth of each of the grooves (3) is 5% to 50% of a thickness of the conductive base strip (1), wherein the grooves (3) are arranged obliquely to the length direction of the conductive base strip (1) in a predefined inclination angle, wherein a total area of base strip regions (4) on at least one of the upper widthwise surface and the lower widthwise surface takes about 30% to 70% of a total area of at least one of the upper widthwise surface and the lower widthwise surface of the conductive base strip (1), wherein one or more solder layers (2) are plated or heat-coated either directly on the conductive base strip (1) or on a protective film formed on the conductive base strip (1), and wherein the one or more solder layers (2) interconnects the photovoltaic interconnect wire with one or more solar cells of photovoltaic modules, wherein each solder layer (2) is one or more of tin-lead alloy, tin-bismuth alloy, tin-copper alloy, tin-cerium alloy, tin-silver alloy, pure tin, and tin-silver-copper alloy, and wherein each solder layer has a total thickness of 3 µm to 30 µm.

2. The photovoltaic interconnect wire according to claim 1, wherein the protective film is plated between the one or more solder layers (2) and the conductive base strip (1), and wherein the protective film has a thickness of 0.1 µm to 10 µm.

3. The photovoltaic interconnect wire according to claim 1, wherein the photovoltaic interconnect wire is characterized in increasing the overall effective output power of the photovoltaic modules by realizing occurrence of total reflection of the sunlight, incident onto the photovoltaic interconnect wire towards the one or more solar cells, at an interface between glass and air, and making the sunlight re-incident onto the solar cells.

4. The photovoltaic interconnect wire according to claim 1, wherein the one or more solar cells and the photovoltaic interconnect wire are firmly soldered together by adjusting the proportion of the total area of the flat base strip regions (4) to the total area of the conductive base strip (1).

5. The photovoltaic interconnect wire according to claim 1, wherein the photovoltaic interconnect wire is characterized in reducing loss in effective cross-section area of the conductive base strip (1) by adjusting inclination angle of the grooves (3), wherein the reduction in the loss of the effective cross-section area of the conductive base strip (1) further minimizes loss in current collecting efficiency of the one or more solder layers (2) thereby ensuring the conductivity of the photovoltaic interconnect wire.

6. The photovoltaic interconnect wire according to claim 1, wherein the photovoltaic interconnect wire is characterized in reducing the risk of cracks and fragments of the one or more solar cells after the cooling of the one or more soldering layers (2) by adjusting the depth and the inclination angle of the grooves (3).

7. The photovoltaic interconnect wire according to claim 1, wherein a soldering force exerted by the photovoltaic interconnect wire is greater than 4N, and wherein soldering force indicates a force required to peel the interconnect wire from the one or more solar cells when the interconnect wire is pulled away from the one or more solar cells along a direction of 45 degrees with respect to the one or more solar cells.

8. The photovoltaic interconnect wire according to claim 1, wherein the conductive base strip (1) is made of either of a copper, a copper-aluminium alloy, a copper-silver alloy, a copper-silver-aluminium alloy, or an alloy formed by adding rare earth materials to high-purity raw copper.

9. The photovoltaic interconnect wire according to claim 1, wherein each solar cell is made of polycrystalline silicon wafer.

10. The photovoltaic interconnect wire according to claim 1, wherein the grooves (3) on a same widthwise surface are arranged as intersecting each other.

11. The photovoltaic interconnect wire according to claim 10, wherein the grooves (3) are straight strip-shaped grooves, and oblique along two inclination directions, grooves respectively along the two inclination directions (3) mirror each other with respect to the length direction of the conductive base strip (1).

12. The photovoltaic interconnect wire according to claim 11, wherein an inclination angle of 25 degrees to 65 degrees is formed between the grooves (3) of both inclination directions and a width direction of the conductive base strip (1).

13. The photovoltaic interconnect wire according to claim 1, wherein the grooves (3) on a same widthwise surface are arranged as being parallel to each other.

14. The photovoltaic interconnect wire according to claim 1, wherein for each of the grooves (3) on the conductive base strip (1), a size of the groove (3) decreases gradually from the opening to the bottom of the groove (3), and a plane tangent to at least one point on a bottom surface of the groove has an inclination angle of 20.9 degrees to 45 degrees with respect to the widthwise surface of the conductive base strip (1).

15. The photovoltaic interconnect wire according to claim 14, wherein the inclination angle indicates an angle between the v-shaped groove (3) and a length direction of the conductive base strip (1).

16. The photovoltaic interconnect wire according to claim 14, wherein the inclination angle indicates an angle between a tangent line at any point on the curve-shaped groove (3) and a length direction of the conductive base strip (1).

17. The photovoltaic interconnect wire according to claim 1, wherein the inclination angle is within a predefined range of 15 degrees to 75 degrees.

* * * * *